US006038520A

United States Patent [19]

Schoonover et al.

[11] Patent Number: 6,038,520

[45] Date of Patent: Mar. 14, 2000

[54] METHOD AND APPARATUS FOR APPLICATION'S SPECIFIC TESTING OF ASSEMBLED CIRCUITS

[75] Inventors: Roy Schoonover, Mississauga; Albert Man, Richmond Hill; Sam Ho, Toronto; Lee Lau, Don Mills, all of Canada

[73] Assignee: ATI Technologies, Inc, Thornhill, Canada

[21] Appl. No.: 09/166,207

[22] Filed: Oct. 2, 1998

[51] Int. Cl.[7] .......... G06F 11/00; H01L 21/66

[52] U.S. Cl. .......... 702/117; 702/118; 702/121; 702/123

[58] Field of Search .......... 702/117, 118, 702/119, 120, 121, 108, 123, 122; 324/73.1; 714/740, 741, 742

[56] References Cited

U.S. PATENT DOCUMENTS 5,278,976 1/1994 Wu .......... 395/575
5,371,748 12/1994 Saw et al. .......... 714/740
5,499,340 3/1996 Barritz .......... 714/47
5,726,920 3/1998 Chen et al. .......... 364/579

*Primary Examiner*—Marc S. Hoff
*Assistant Examiner*—Bryan Bui
*Attorney, Agent, or Firm*—Markison & Reckamp, PC

[57] ABSTRACT

A method and apparatus for testing specific assembled circuits begins by configuring a plurality of applications specific testing entities to test assembled circuits, where the configuring is based on the types of assembled circuits being tested. Next, a specific assembled circuit testing program is provided to the corresponding application specific testing entity based on the type of assembled circuits it is testing. In addition to providing the testing programs to the testing entities, programming instructions are provided to a programmable handler to pick and place the appropriate assembled circuits with the corresponding applications specific testing entities. When the testing of a particular assembled circuit is complete, a test complete indication is provided. When the test complete indication is received by the host, programming instructions are provided to the programmable handler to remove the integrated circuit from the testing entity and place another integrated circuit in the proximity of the testing entity for subsequent testing.

32 Claims, 4 Drawing Sheets

METHOD AND APPARATUS FOR APPLICATION'S SPECIFIC TESTING OF ASSEMBLED CIRCUITS

TECHNICAL FIELD OF THE INVENTION

This invention relates generally to testing of circuits and more particularly to testing of specific assembled circuits.

BACKGROUND OF THE INVENTION

Testing of newly manufactured products is done to ensure that the product conforms to its operating specification requirements. Depending on the type of product, various testing techniques are used. For example, for hardware devices, such as printed circuit boards, specific test fixtures are created that provide an input stimulus and monitor outputs of the device for proper responses. If, for each of the input stimulus, the output is as anticipated, the printed circuit board passed the test.

Automated test equipment is generally used to test integrated circuits, such as microprocessors, microcontrollers, video graphic processors, etc. Such automated test equipment is a generic device that, based on a customized test program, can test most integrated circuits. To develop the customized test program, the simulated design verification suite of the integrated circuit is utilized to create a virtual environment for the integrated circuit to be tested. As is known, the simulated design information suite is based on the hardware description language (HDL) that was used to design the integrated circuit. While the automated test equipment, which is a general purpose tester, provides flexibility such that various integrated circuits may be tested, it is generally a costly piece of equipment (e.g., approximately $2 Million Dollars U.S.). In addition, the development of the customized test program is somewhat time consuming, which adds additional costs to the overall automated testing process.

As an alternative to using automated test equipment, a dedicated test fixture may be designed that simulates the real environment in which the integrated circuit will be used. For example, for a microprocessor, the test fixture may include a motherboard operably coupled into a personal computer. By exercising the integrated circuit under test in this manner, the human tester may coordinate and/or customize the individual testing of an integrated circuit. While this technique works well for specific integrated circuits, it requires a substantial amount of human interaction, which may lead to error and is generally much slower than an automated process. However, the specific manual test fixtures are generally much less expensive than the automated test equipment.

Therefore, a need exists for an automated specific test environment for testing specific circuits, including integrated circuits with the cost savings of specific test fixtures but still providing the flexibility of automated test equipment.

DETAILED DESCRIPTION OF A PREFERRED EMBODIMENT

Generally, the present invention provides a method and apparatus for testing specific assembled circuits. Such processing begins by configuring a plurality of applications specific testing entities to test assembled circuits, where the configuring is based on the types of assembled circuits being tested. As such, a video graphics circuit may be tested on one or more application specific testing entities while a microprocessor, digital signal processor, microcomputer, etc., may be tested on another application specific testing entity. Next, a specific assembled circuit testing program is provided to the corresponding application specific testing entity based on the type of assembled circuits it is testing. As such, the specific testing entity that is testing video graphics circuits will receive a specific video graphic integrated circuit testing program. In addition to providing the testing programs to the testing entities, programming instructions are provided to a programmable handler to pick and place the appropriate assembled circuits with the corresponding applications specific testing entities. As such, the programmable handler is programmed to provide video graphic integrated circuits to the testing entity that is testing those devices, provide the microprocessors to the testing entity that is testing microprocessors, etc.

When the testing of a particular assembled circuit is complete, a test complete indication is provided. When the test complete indication is received by the host, programming instructions are provided to the programmable handler to remove the integrated circuit from the testing entity and place another integrated circuit in the proximity of the testing entity for subsequent testing. With such a method and apparatus, the benefits of automated test equipment may be obtained without the substantial costs for such equipment and without the substantial time investment for generating the test programs, but maintaining the flexibility of testing specific types of assembled circuits.

Figure 1:
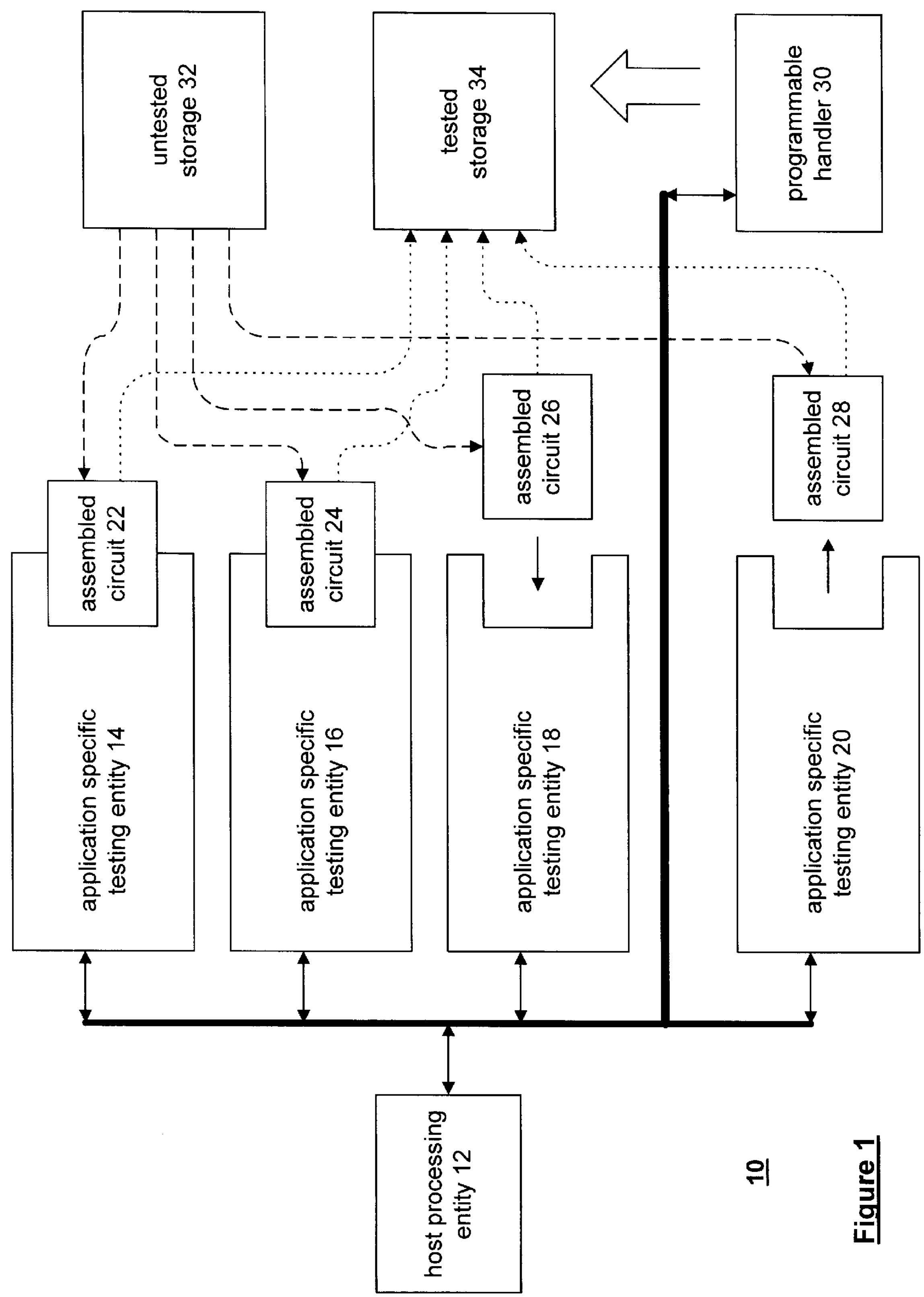
FIG. 1 illustrates a schematic block diagram of an application specific testing system in accordance with the present invention.

The present invention can be more fully described with reference to FIGS. 1 through 6. FIG. 1 illustrates a schematic block diagram of an application specific testing system 10. The system 10 includes a host processing entity 12, a plurality of application specific testing entities 14–20, a plurality of assembled circuits 22–28, a programmable handler/prober 30, an untested storage area 32, and a tested storage area 34. The host processing entity 12 may be a microprocessor, microcontroller, microcomputer, digital signal processor, central processing unit, personal computer, work station, and/or any programmable device that manipulates digital information based on programming instructions. In addition, the host processing entity includes sufficient memory to store a plurality of testing programs and specific testing system operational controlling instructions as subsequently described with reference to FIG. 6.

The applications specific testing entities 14–20 depend primarily on the assembled circuits 22–28 that they will be testing. For example, if the assembled circuits 22–28 are components (i.e., printed circuit boards, integrated circuits, applications specific integrated circuits, a wafer of integrated circuit die, etc.) that are incorporated into a computer, (e.g., work station, personal computer, lap top computer, hand held computer, personal digital assistant, etc.), the applications specific testing entity will be a computer less the assembled circuit. For example, the assembled circuit 22, may be a video graphics board, an audio processing board, a motherboard, a microprocessor integrated circuit, a memory device, a video graphics integrated circuit, etc. As such, the applications specific testing entity 14–20 would include the relevant portions of a computer to test the assembled circuits 22–28. As such, the applications specific testing entities include a computer structure that lacks a corresponding component of the assembled circuit. When the assembled circuit is coupled to the applications specific testing entity, that combination produces a specific functional computer, i.e., a computing device that is capable of testing, to a satisfactory level, the assembled circuit.

Each of the application specific testing entities 14–20 may be testing a similar type of assembled circuit in a synchronous or asynchronous manner with the other application specific testing entities. Alternatively, each of the specific testing entities may be testing different types of assembled circuits. Regardless of the types of assembled circuits being tested, the host processing entity coordinates such testing. The host processing entity may provide a specific assembled circuit testing program to the applications specific testing entity that is testing the particular assembled circuit. For example, the host processing entity would provide a video graphics circuit test program to the application specific testing entity that is testing a video graphic integrated circuit. Such providing may be done by the host processing entity acting as a server wherein the specific testing program is retrieved from the host processing entity, or may be done by enabling the specific test program stored within the application specific testing entity.

In addition to providing the specific assembled circuit testing program to the applications specific testing entities, the host processing entity provides the programming instructions to the programmable handler/prober 30. The programmable handler/prober 30 functions may function as a handler to handle packaged integrated circuits and/or as a prober to handle wafers. As used herein, the term programmable handler shall include a programmable handler, a programmable prober, or both. The programming instructions provided by the host processing entity causes the that the handler to pick, place, and replace the corresponding assembled circuits 22–28 with the appropriate application specific testing entity 14–20. As such, the programmable handler 30 is programmed to retrieve the assembled circuits 22–28 from the untested storage area 32 and provide them to the appropriate application specific testing entity. When the testing is complete the programmable handler 30, based on programming instructions, retrieves the assembled circuit 22–28 and places it in the tested storage area 34. As configured, the application specific testing entity, once an assembled circuit is placed for testing, performs all of the necessary testing steps.

The test programs used by the applications specific testing entities may be directly derived from the environment in which the assembled circuit is utilized. As such, the costly step of generating the test programs from the simulated design verification suite is substantially reduced. Thus, in addition to the application specific testing entities being less expensive than automated test equipment, the application specific testing entities require substantially less time to develop corresponding test programs, since the testing is at least partially, inherent within the testing entities.

Figure 2:
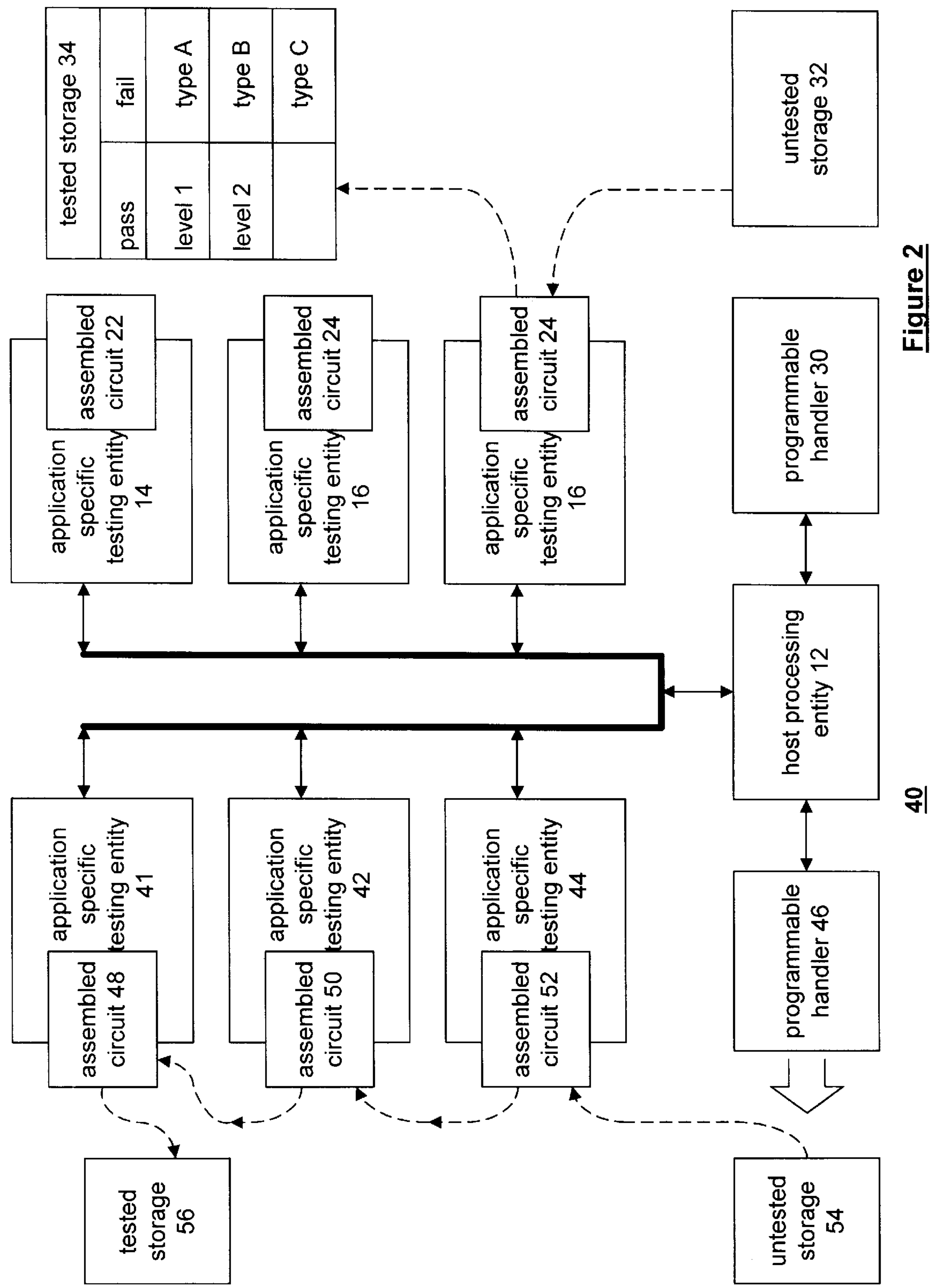
FIG. 2 illustrates a schematic block diagram of an alternate application specific testing system in accordance with the present invention.

FIG. 2 illustrates a schematic block diagram of an alternate testing system 40. The testing system 40 includes the host processing entity 12, a plurality of applications specific testing entities 14–18, and 41, 42 and 44, a plurality of assembled circuits 22–26 and 48–52, programmable handlers/probers 30 and 46, untested storage areas 32 and 54, and tested storage areas 34 and 56. As shown, the system 40 includes two groupings of applications specific testing entities. The first grouping includes application specific testing entities 14–18 and the associated assembled circuits 22–26. The functionality of this group is similar to that described with reference to FIG. 1. Note, however, that the tested storage area 34 has been divided into a plurality of categories, which includes a pass section and a fail section. Depending on the level at which an assembled circuit passes the test, it can go into a plurality of pass levels. For example, if a particular device passes a certain temperature threshold it would go into one category; if it fails that test but passed a lower temperature threshold it would go into another category. In addition, the failure portion of the test storage area 34 may be divided into a plurality of failure categories. As the assembled circuits are tested, the host processing entity 12 may accumulate and compile test results to determine the type of failures and place such units that failed in the appropriate bin of the failure portion of the test storage area 34. In addition, the host processing entity may generate reports, test failure analysis, etc. from the test results obtained from each of the applications specific testing entities.

The second grouping of applications specific entities 41, 42 and 44, test a specific portion of an assembled circuit. As shown, the programmable handler 46, based upon programming instructions from the host processing entity 12, causes assembled circuits 48–52 to be retrieved from the untested storage area 54 and initially placed with the application specific testing entity 44. Once the application specific testing entity 44 has performed its specific test upon the assembled circuit, it is replaced, by the programmable handler 46, under the control of the processing entity 12, to the next application specific testing entity 42. Once this application specific testing entity performs its test upon the assembled circuit, it is passed, by the programmable handler 46, to the application specific testing entity 41. Once the applications specific testing entity 41 has performed its function upon it, the assembled circuit is placed in the tested storage area 56. Note that if the assembled circuit failed the testing of either application specific testing entities 42 or 44, the host would instruct the programmable handler 46 to place the assembled circuit in the failure portion of the tested storage area 56.

Figure 3:
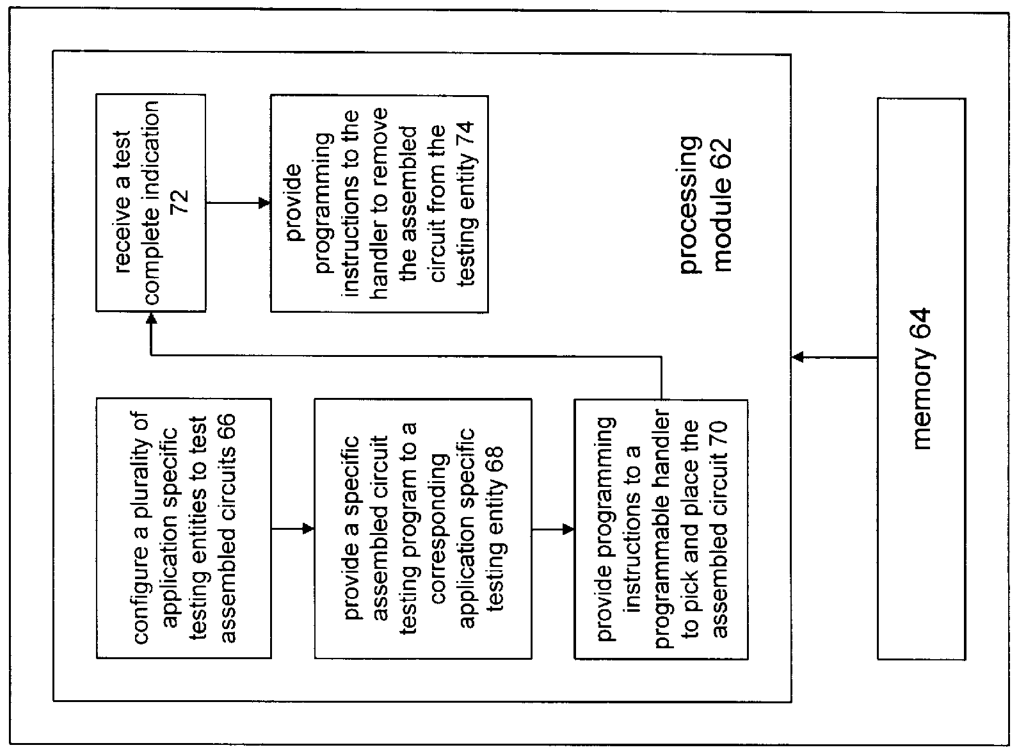
FIG. 3 illustrates a schematic block diagram of a host processing entity in accordance with the present invention.

FIG. 3 illustrates a schematic block diagram of a host processing entity 60 that includes a processing module 62 and memory 64. The processing module 62 may be a microprocessor, microcomputer, digital signal processor, central processing unit, state machine, logic circuitry, and/or any other device that manipulates digital information based on operating instructions. The memory 64 may be read-only memory, random access memory, floppy disk memory, hard-disk memory, magnetic tape memory, DVD memory, CD memory and/or any device that stores digital information. Note that if the processing module 62 includes a state machine to perform one or more of its functions, the memory 64 along with the associated operating instructions are embedded within the circuitry that comprises the state machine.

The memory 64 stores operating instructions that when processed by the processing module 62 causes the processing module to function as a plurality of circuits 66–74. While performing the operating instructions, the processing module 62 functions as circuit 66 to configure a plurality of application specific testing entities to test assembled circuits. The processing module then functions as circuit 68 to provide a specific assembled circuit test program to a corresponding application specific testing entity. Next, the processing module functions as circuit 70 to provide programming instructions to a programmable handler to pick and place the assembled circuits. Next, the processing module functions as circuit 72 to receive a test complete indication. The processing module then functions as circuit 74 to provide programming instructions to the programmable handler to remove the assembled circuit from the testing entity. The operating instructions stored in memory 64 and executed by processing module 62 will be discussed in greater detail with reference to FIG. 4.

Figure 4:
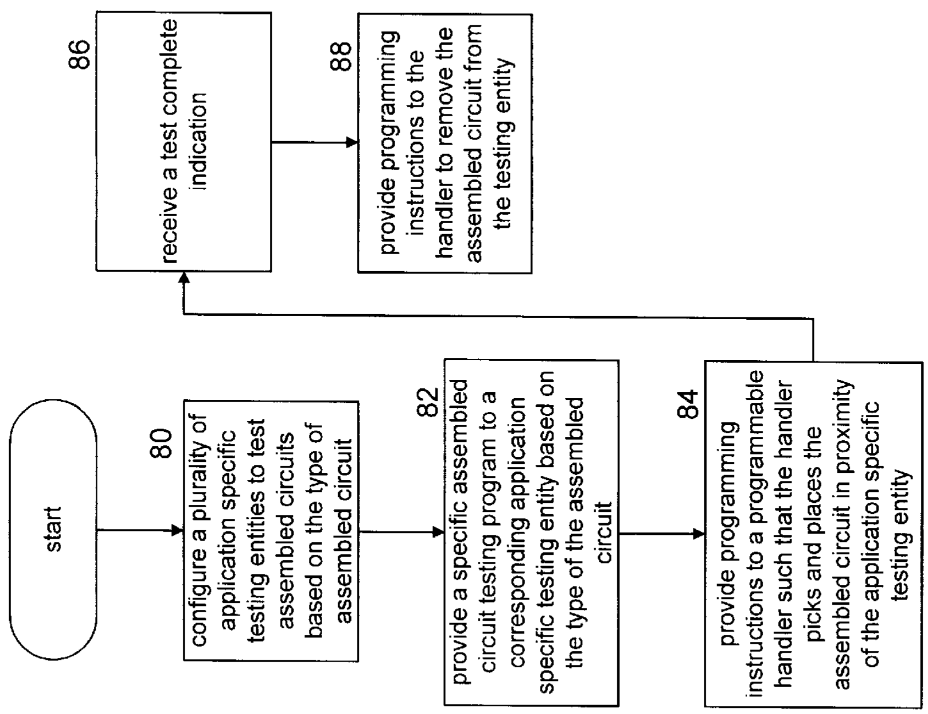
FIG. 4 illustrates a logic diagram of a method for controlling an application specific testing system in accordance with the present invention.

FIG. 4 illustrates a logic diagram of a method for testing assembled circuits. The process begins at step 80 where a plurality of applications specific testing entities are configured to test assembled circuits and may further be configured based on the type of assembled circuits. For example, the plurality of applications specific testing entities may be configured to each test the same type of assembled circuits (e.g., a video graphic integrated circuit, a microprocessor, a motherboard, etc.). As such, the host processing entity would provide data to the application specific testing entities, where the data includes the type of assembled circuits and the corresponding quantities of each assembled circuit. Based on this data, the application specific testing entities would be grouped to test like types of assembled circuits. In addition, the number of testing entities within a group is dependent on the quantity of the particular type of the assembled circuits being tested. As such, the host processing entity may configure the plurality of the applications specific testing entities in a multitude of configurations based on the types and quantities of assembled circuits to be tested. Note that the host processing entity may enable the testing entities to test the assembled circuits in synchronous or asynchronous manner.

The process then proceeds to step 82 where a specific assembled circuit test program is provided to a corresponding application testing entity based on the type of assembled circuit. The providing may be done by enabling the specific assembled test program that is stored within the applications specific testing entity. Alternatively, the specific assembled circuit testing program may be stored in the host processing entity, which functions as a server for the plurality of applications specific testing entities, and provides the appropriate test program to the corresponding testing entity. Note that the assembled test program may include an analog circuit testing program that tests an analog portion of the at least one of the plurality of assembled circuits based on acceptance of an expected signature.

The process then proceeds to step 84 where programming instructions are provided to the programmable handler. The programming instructions enable the handler to pick and place assembled circuits in proximity of the applications specific testing entity. The process then proceeds to step 86 where a test complete indication is received, where the test complete indication may be test results, a test end flag, and/or an expiration of a test time period. Note that if the test complete indication is based on a expiration of a test time, it is indicative that the testing entity did not complete the test. When such a condition arises, the host processing entity may need to reset the applications specific testing entity. If the test complete indication is test results, the test results may be compiled into categories of at least test passes and types of test failures. As discussed with reference to FIG. 2, a plurality of levels of test pass categories may be utilized as well as many types of test failures.

Note that prior to step 86, the host processing entity may receive a placing indication from the programmable handler where the placing indication indicates that the placed assembled circuit has been placed. Having received the placing indication, the host processing entity would enable the corresponding application specific testing entity to commence its testing upon the placed assembled circuit. The enabling would include causing the specific testing entity to apply power to the assembled circuit and test the assembled circuit based on the specific assembled circuit testing program. Once the test is complete, the host processing entity would provide a disabling signal to the application specific testing entity, such that the testing entity would remove power from the assembled circuit.

The process then proceeds to step 88 where programming instructions are provided to the handler to remove the assembled circuit from the testing entity. In addition, the programming instructions may direct the handler to place the assembled circuit in one of a plurality of categories within a test storage area.

Figure 5:
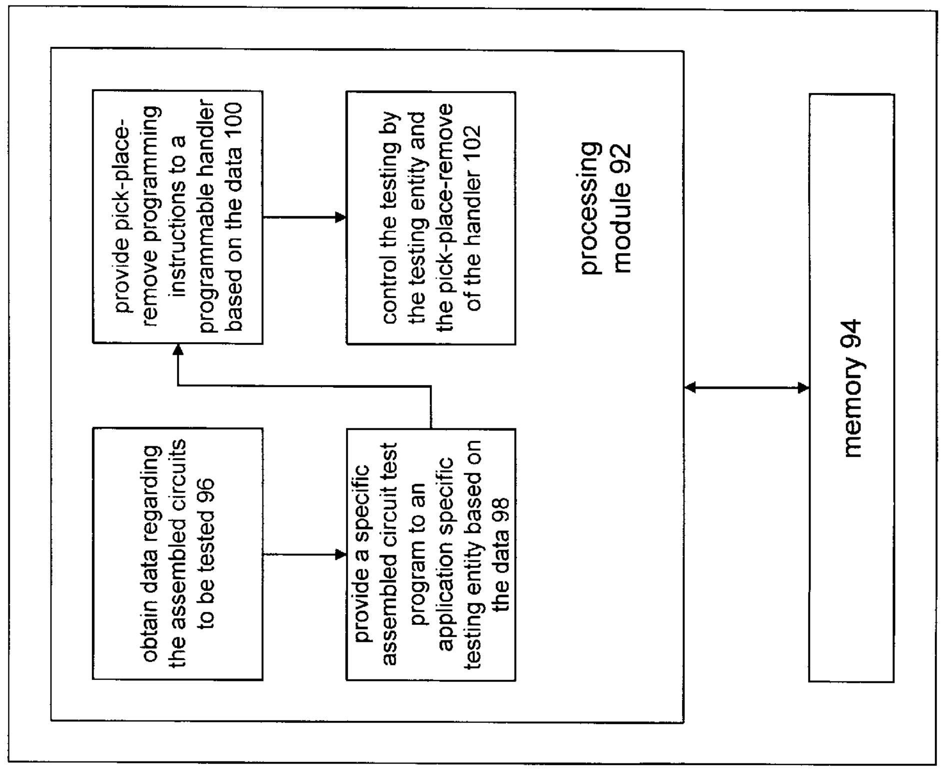
FIG. 5 illustrates a schematic block diagram of an alternate host processing entity in accordance with the present invention.

FIG. 5 illustrates an alternate schematic block diagram of a host processing entity 90. The host processing entity 90 includes a processing module 92 and memory 94. The processing module 92 may be a microprocessor, microcomputer, digital signal processor, central processing unit, state machine, logic circuitry and/or any other device that manipulates digital information based on programming instructions. The memory 94 may be read-only memory, random access memory, floppy disk memory, hard drive memory, magnetic tape memory, DVD memory, CD memory, and/or any device that stores digital information. Note that when the processing module implements one or more of its functions via a state machine, the operating instructions stored in memory may be embedded within the logic circuitry making up the state machine.

The memory 94 stores operating instructions that, when executed by the processing module 92, cause the processing module to function as a plurality of circuits 96–102. While performing the operating instructions, the processing module functions as circuit 96 to obtain data regarding the assembled circuits to be tested. The processing module then functions as circuit 98 to provide a specific assembled circuit test program to an application specific testing entity based on the data. The processing module then functions as circuit 100 to provide pick, place and remove programming instructions to a programmable handler based on the data. The processing module then functions as circuit 102 to control the testing by the testing entity and the pick, place and remove of the handler. The operating instructions stored in memory and executed by processing module 92 are further discussed with reference to FIG. 6.

Figure 6:
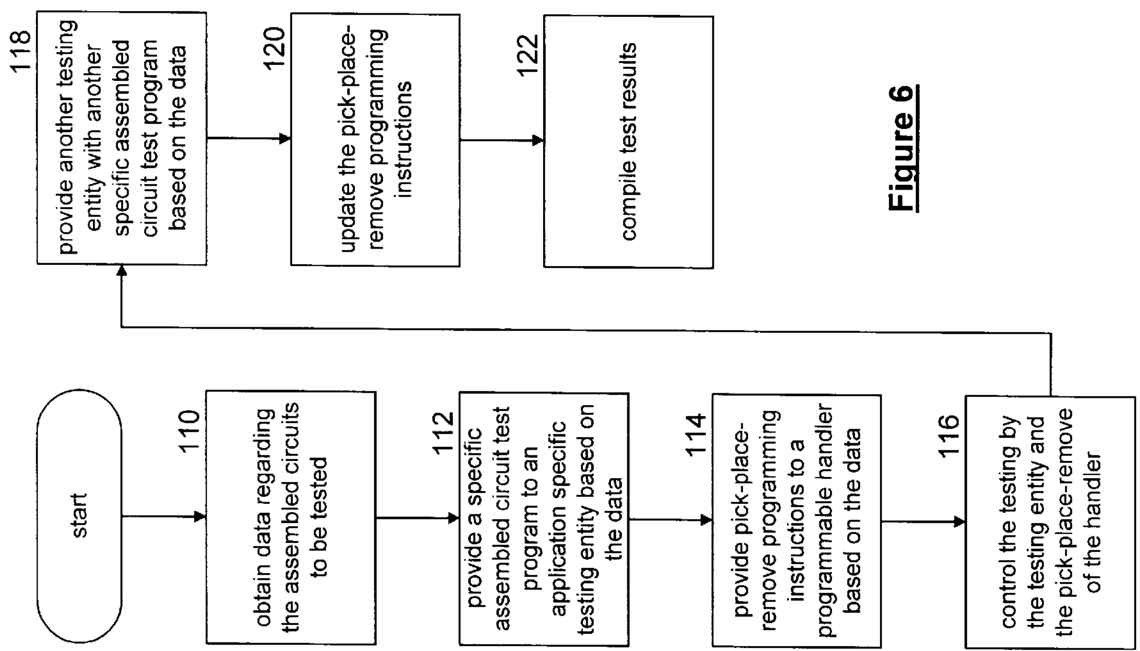
FIG. 6 illustrates a logic diagram of an alternate method for controlling the applications specific testing system.

FIG. 6 illustrates a logic diagram for testing assembled circuits. The process begins at step 110 where data regarding the assembled circuits to be tested is obtained. The data includes the type of assembled circuits and/or quantities of the assembled circuits. Such data may be obtained by a user interface, by scanning an identification code of the assembled circuit, and/or by initiating a generic test to determine the type of assembled circuit. The process then proceeds to step 112 where a specific assembled circuit test program is provided to an application specific testing entity based on the data.

The process then proceeds to step 114 where pick, place and remove programming instructions are provided to a programmable handler based on the data. The process then proceeds to step 116 where the testing by the testing entity and the pick, place and remove of the handler are controlled by the host processing entity. Such control may be done by receiving a placing indication from the programmable handler, which indicates that the assembled circuit has been placed with the testing entity. Having received the placing indication, the host processing entity then enables the application specific testing entity to commence testing of the assembled circuit. The enabling includes providing power to the assembled circuit and then testing the assembled circuit based on the specific assembled circuit testing program. Once the test is complete, the host processing entity disables the applications specific testing entity such that it removes power from the assembled circuit.

The process then proceeds to 118 where another testing entity is provided with another specific assembled test circuit program based on the data. The process then proceeds to step 120 where the pick, place and remove programming instructions are updated. The process then proceeds to step 122 where the host processing entity compiles test results. As configured, the host processing entity may cause at least some of the plurality of applications testing entities to test different types of assembled circuits in a time contemporaneous manner.

The preceding discussion has presented a method and apparatus for testing specific types of assembled circuits. For example, the assembled circuits may be microprocessors, video graphics circuits, circuit boards, and/or wafers that include integrated circuit die. By utilizing computer structure equipment that lacks a corresponding component of the assembled circuit, the test programs may be readily generated from the environment in which the assembled circuit would be utilized. As such, significant time is saved in generating test programs in comparison with automated test equipment. In addition, by utilizing a host processor as described, the flexibility of the automated test equipment is achieved, without the cost.

What is claimed is:

1. An application specific testing system comprises:

a plurality of application specific testing entities, wherein each of the plurality of application specific testing entities is programmable to test at least one of a plurality of assembled circuits;

a programmable handler operable to pick and place assembled circuits of the plurality of assembled circuits in proximity of corresponding ones of the plurality of application specific testing entities such that placed assembled circuits are subject to testing; and a host processing entity operably coupled to the plurality of application specific testing entities and the programmable handler, wherein the host processing entity administers picking and placing by the programmable handler and testing by the plurality of application specific testing entities.

2. The application specific testing system of claim 1, wherein an application specific testing entity of the plurality of application specific testing entities further comprises a computer structure lacking a corresponding component of the one of the plurality of assembled circuits, wherein, when the one of the plurality of assembled circuits is being tested by the application specific testing entity, a combination of the one of the plurality of assembled circuits and the application specific testing entity forms a specific functional computer.

3. The application specific testing system of claim 1, wherein the plurality of assembled circuits further comprises at least one type of: assembled printed circuit boards, integrated circuits, Application Specific Integrated Circuits, and a wafer of integrated circuit die.

4. The application specific testing system of claim 1, wherein the host processing entity further comprises a plurality of testing programs and specific testing system operation controlling instructions that cause at least some of the plurality of application specific testing entities to test different types of the plurality of assembled circuits in a time contemporaneous manner.

5. The application specific testing system of claim 1, wherein the host processing entity further comprises operational controlling instructions that cause the plurality of application specific testing entities to provide testing data to the host processing entity, wherein the host processing entity compiles the testing data into test result categories.

6. The application specific testing system of claim 1, wherein the host processing entity further comprises a plurality of specific assembled circuit testing programs, and wherein the host processing entity provides at least one of the plurality of specific assembled circuit testing programs to at least one of the plurality of application specific testing entities based on the at least one of the plurality of assembled circuits under test.

7. The application specific testing system of claim 6, wherein at least one of the plurality of specific assembled circuit testing programs further comprises an analog circuit testing program that tests an analog portion of the at least one of the plurality of assembled circuits based on acceptance of an expected signature.

8. The application specific testing system of claim 1, wherein the host processing entity further comprises operational controlling instructions that cause the host processing entity to monitor testing by the plurality of application specific testing entities, and wherein, when one of the plurality of application specific testing entities overruns a test time period, the host processing entity reboots the one of the plurality of application specific testing entities.

9. A method for testing assembled circuits, the method comprises the steps of:

a) configuring a plurality of application specific testing entities to test the assembled circuits based on types of the assembled circuits to be tested;

b) providing a specific assembled circuit testing program to a corresponding one of the plurality of application specific testing entities based on the type of assembled circuits being tested by the corresponding one of the plurality of application specific testing entities;

c) providing programming instructions to a programmable handler to pick and place at least one of the assembled circuits in proximity of the corresponding one of the plurality of application specific testing entities to produce a placed assembled circuit;

d) receiving a test complete indication by the host processing entity when testing of the placed assembled circuit by the corresponding one of the plurality of application specific testing entities is to be complete; and e) providing programming instructions to the programmable handler to remove the placed assembled circuit in one of a plurality of application specific testing entities and to pick and place at least another one of the assembled circuits to a corresponding application specific testing entity when the test complete indication hasbeen received.

10. The method of claim 9, wherein step (a) further comprises configuring the plurality of application specific testing entities by enabling the plurality of application specific testing entities to test a single type of assembled circuits.

11. The method of claim 9, wherein step (a) further comprises configuring the plurality of application specific testing entities by:

obtaining data regarding the assembled circuits to be tested, wherein the data includes type of assembled circuits and corresponding quantities;

configuring the plurality of application specific testing entities into groups based on the type of assembled circuits and the corresponding quantity.

12. The method of claim 9, wherein step (b) further comprises:

enabling one of a plurality of specific assembled circuit testing programs stored in the corresponding one of the plurality of application specific testing entities based on the type of assembled circuit being tested.

13. The method of claim 9, wherein step (b) further comprises:

providing one of a plurality of specific assembled circuit testing programs stored in a host processing entity to the corresponding one of the plurality of application specific testing entities based on the type of assembled circuit being tested.

14. The method of claim 9, wherein the test complete indications further comprises at least one of: test results, a test end flag, and an expiration of a test time period.

15. The method of claim 14 further comprises compiling the test results into categories of at least level of test passes and types of test failures.

16. The method of claim 9 further comprises:

receiving a placing indication by the host processing entity from the programmable handler, wherein the placing indication indicates that the placed assembled circuit is placed;

enabling the corresponding one of the plurality of application specific testing entities to commence testing when the placing indication is received by the host processing entity, wherein the enabling includes applying power to the assembled circuit and testing the assembled circuit based on the specific assembled circuit testing program; and disabling the corresponding one of the plurality of application specific testing entities when the test complete indication is received by the host processing entity, wherein the disabling includes removing power from the assembled circuit.

17. A method for testing assembled circuits, the method comprises the steps of:

a) obtaining data regarding the assembled circuits to be tested, wherein the data includes at least one of: type of assembled circuits and quantities of the assembled circuits by type;

b) providing a specific assembled circuit test program by a host processing entity to a configured one of a plurality of application specific testing entities based on the data;

c) providing pick-place-remove programming instructions by the host processing entity to a programmable handlers based on the data; and d) controlling by the host processing entity testing by the configured one of the plurality of application specific testing entities and picking, placing, and removing of the assembled circuits by the programmable handler.

18. The method of claim 17, wherein step (a) further comprises obtaining the data from at least one of: user interface, scan of identifying code of the assembled circuit, and package type.

19. The method of claim 17 further comprises:

providing another specific assembled circuit test program by the host processing entity to another configured one of the plurality of application specific testing entities based on the data; and updating the pick-place-remove programing instructions such that the programmable handler provides a first type of assembled circuits to the configured one of the plurality of application specific testing entities and a second type of assembled circuits to the another configured one of the plurality of application specific testing entities.

20. The method of claim 17 further comprises compiling test results from the configured one of the plurality of application specific testing entities by the host processing entity.

21. The method of claim 17, wherein step (d) further comprises:

receiving a placing indication by the host processing entity from the programmable handler, wherein the placing indication indicates that the assembled circuit is placed;

enabling the configured one of the plurality of application specific testing entities by the host processing entity to commence testing of the assembled circuit when the placing indication is received, wherein the enabling includes applying power to the assembled circuit and testing the assembled circuit based on the specific assembled circuit testing program; and disabling the configured one of the plurality of application specific testing entities by the host processing entity when a test complete indication is received, wherein the disabling includes removing power form the assembled circuit.

22. A host processing entity for use in an application specific testing system, the host processing entity comprises:

a processing module; and memory operably coupled to the processing module, wherein the memory includes operating instructions that cause the processing module to (a) configure a plurality of application specific testing entities to test the assembled circuits based on types of the assembled circuits to be tested; (b) provide a specific assembled circuit testing program to a corresponding one of the plurality of application specific testing entities based on the type of assembled circuits being tested by the corresponding one of the plurality of application specific testing entities; (c) provide programming instructions to a programmable handler to pick and place at least one of the assembled circuits in proximity of the corresponding one of the plurality of application specific testing entities to produce a placed assembled circuit; (d) receive a test complete indication when testing of the placed assembled circuit by the corresponding one of the plurality of application specific testing entities is to be complete; and (e) provide programming instructions to the programmable handler to removed the placed assembled circuit and to pick and place at least another one of the assembled circuits when the test complete indication has been received.

23. The host processing entity of claim 22, wherein the memory further comprises operating instructions that cause the processing module to configure the plurality of application specific testing entities by enabling the plurality of application specific testing entities to test a single type of assembled circuits.

24. The host processing entity of claim 22, wherein the memory further comprises operating instructions that cause the processing module to configure the plurality of application specific testing entities by:

obtaining data regarding the assembled circuits to be tested, wherein the data includes type of assembled circuits and corresponding quantities;

configuring the plurality of application specific testing entities into groups based on the type of assembled circuits and the corresponding quantity.

25. The host processing entity of claim 22, wherein the memory further comprises operating instructions that cause the processing module to:

enable one of a plurality of specific assembled circuit testing programs stored in the corresponding one of the plurality of application specific testing entities based on the type of assembled circuit being tested.

26. The host processing entity of claim 22, wherein the memory further comprises operating instructions that cause the processing module to:

provide one of a plurality of specific assembled circuit testing programs stored in a host processing entity to the corresponding one of the plurality of application specific testing entities based on the type of assembled circuit being tested.

27. The host processing entity of claim 22, wherein the memory further comprises operating instructions that cause the processing module to compile test results into categories of at least level of test passes and types of test failures.

28. The host processing entity of claim 22, wherein the memory further comprises operating instructions that cause the processing module to:

receive a placing indication from the programmable handler, wherein the placing indication indicates that the placed assembled circuit is placed;

enable the corresponding one of the plurality of application specific testing entities to commence testing when the placing indication is received, wherein the enabling includes applying power to the assembled circuit and testing the assembled circuit based on the specific assembled circuit testing program; and disable the corresponding one of the plurality of application specific testing entities when the test complete indication is received, wherein the disabling includes removing power from the assembled circuit.

29. A host processing entity for use in an application specific testing system, the host processing entity comprises:

a processing module; and memory operably coupled to the processing module, wherein the memory includes operating instructions that cause the processing module to (a) obtain data regarding the assembled circuits to be tested, wherein the data includes at least one of: type of assembled circuits and quantities of the assembled circuits by type; (b) provide a specific assembled circuit test program to a configured one of a plurality of application specific testing entities based on the data; (c) provide pick-place-remove programming instructions to a programmable handlers based on the data; and (d) control testing by the configured one of the plurality of application specific testing entities and picking, placing, and removing of the assembled circuits by the programmable handler.

30. The host processing entity of claim 29, wherein the memory further comprises operating instructions that cause the processing module to:

provide another specific assembled circuit test program to another configured one of the plurality of application specific testing entities based on the data; and update the pick-place-remove programming instructions such that the programmable handler provides a first type of assembled circuits to the configured one of the plurality of application specific testing entities and a second type of assembled circuits to the another configured one of the plurality of application specific testing entities.

31. The host processing entity of claim 29, wherein the memory further comprises operating instructions that cause the processing module to compile test results from the configured one of the plurality of application specific testing entities.

32. The host processing entity of claim 29, wherein the memory further comprises operating instructions that cause the processing module to:

receive a placing indication from the programmable handler, wherein the placing indication indicates that the assembled circuit is placed;

enable the configured one of the plurality of application specific testing entities to commence testing of the assembled circuit when the placing indication is received, wherein the enabling includes applying power to the assembled circuit and testing the assembled circuit based on the specific assembled circuit testing program; and disable the configured one of the plurality of application specific testing entities when a test complete indication is received, wherein the disabling includes removing power from the assembled circuit.

* * * * *